(12) United States Patent
Weng et al.

(10) Patent No.: US 7,195,956 B2
(45) Date of Patent: Mar. 27, 2007

(54) METHOD FOR BALANCING MOLDING FLOW DURING THE ASSEMBLY OF SEMICONDUCTOR PACKAGES WITH DEFECTIVE CARRYING UNITS

(75) Inventors: Gwo-Liang Weng, Kaohsiung (TW); Shih-Chang Lee, Dashe Township, Kaohsiung County (TW); Wei-Chang Tai, Kaohsiung (TW)

(73) Assignee: Advanced Semiconductor Engineering, Inc., Kaohsiung (TW)

( * ) Notice: Subject to any disclaimer, the term of this patent is extended or adjusted under 35 U.S.C. 154(b) by 97 days.

(21) Appl. No.: 11/140,054

(22) Filed: May 27, 2005

(65) Prior Publication Data

US 2005/0266616 A1 Dec. 1, 2005

(30) Foreign Application Priority Data

May 31, 2004 (TW) .............................. 93115529 A

(51) Int. Cl.
*H01L 21/00* (2006.01)
(52) U.S. Cl. ...................................... 438/118; 438/110
(58) Field of Classification Search ................ 438/107, 438/110, 118, 119, 125, 126, 127
See application file for complete search history.

(56) References Cited

U.S. PATENT DOCUMENTS

| | | | | |
|---|---|---|---|---|
| 6,087,202 A | * | 7/2000 | Exposito et al. | 438/113 |
| 6,544,814 B1 | * | 4/2003 | Yasunaga et al. | 438/108 |
| 6,558,975 B1 | * | 5/2003 | Sugino et al. | 438/64 |
| 6,780,670 B1 | * | 8/2004 | Park | 438/106 |
| 6,933,173 B1 | * | 8/2005 | Yunus | 438/110 |
| 2004/0262776 A1 | * | 12/2004 | Lebonheur et al. | 257/778 |

* cited by examiner

*Primary Examiner*—S. V. Clark
(74) *Attorney, Agent, or Firm*—Thomas, Kayden, Horstemeyer & Risley

(57) ABSTRACT

A method for balancing molding flow during the assembly of semiconductor packages with defective carrying units includes providing a chip carrier, which includes a number of good carrying units and at least a defective carrying unit. Then, a number of chips are attached to the good carrying units of the chip carrier, and a chip-imitative glue is formed on the defective carrying unit of the chip carrier. Next, a molding compound is formed on the chip carrier via molding to seal the chips and the chip-imitative glue, thereby improving the balance of molding flow.

20 Claims, 9 Drawing Sheets

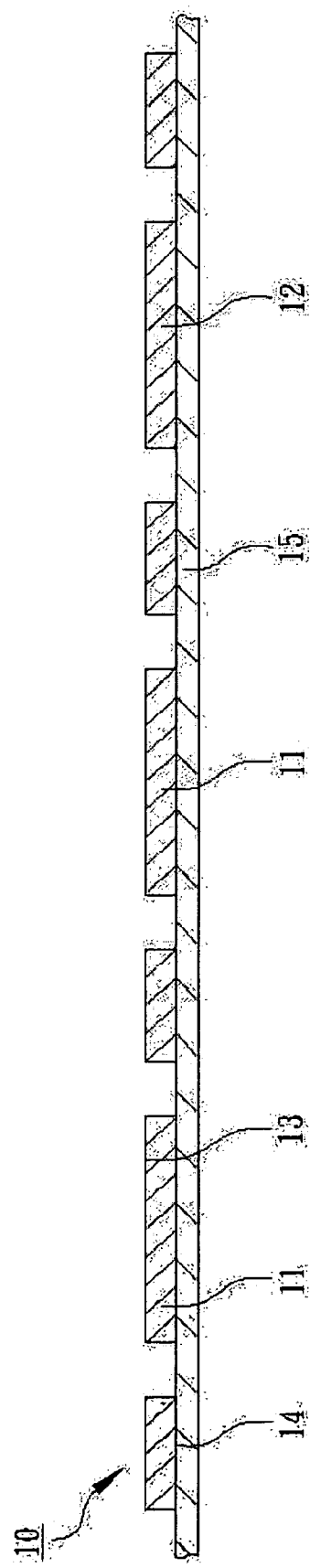
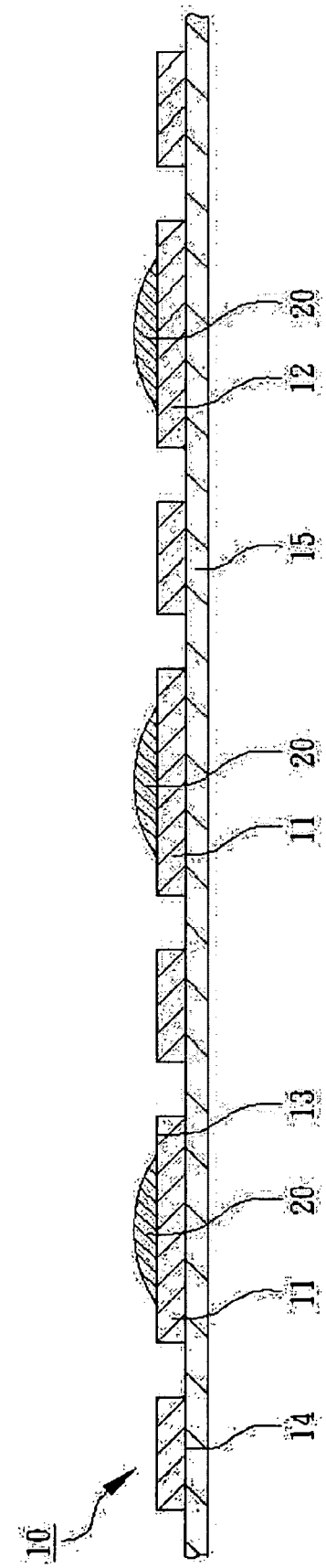
FIG. 1A(PRIOR ART)
FIG. 1B(PRIOR ART)

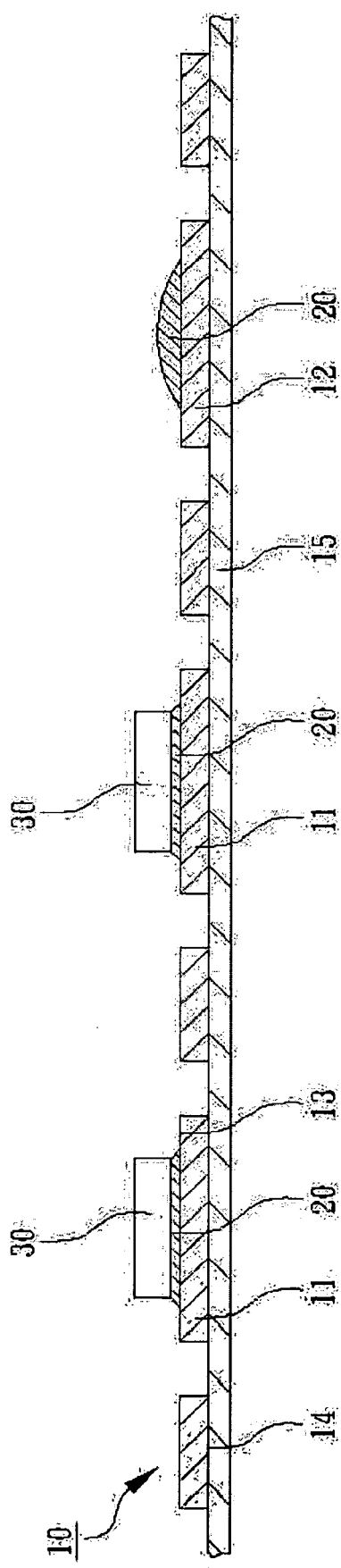
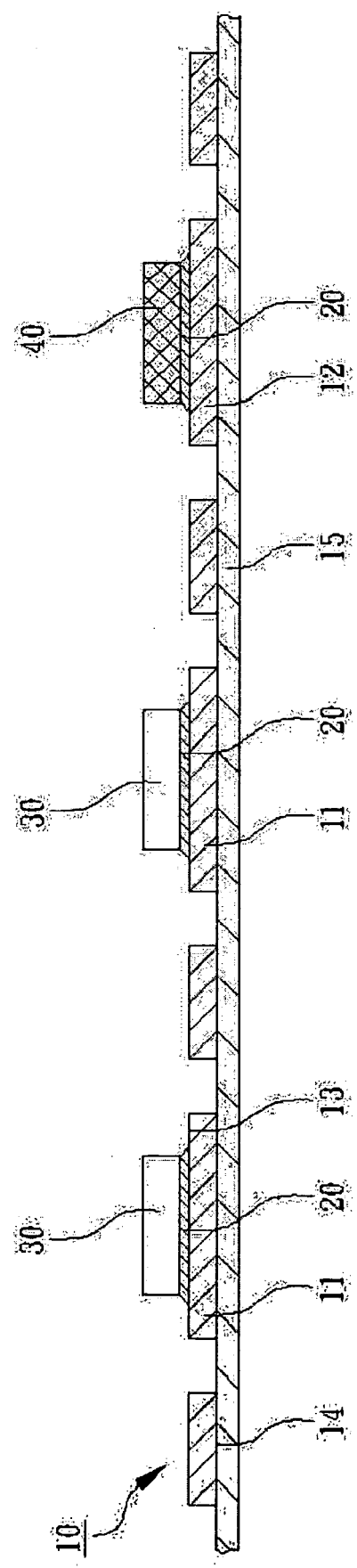
FIG. 1C (PRIOR ART)
FIG. 1D (PRIOR ART)

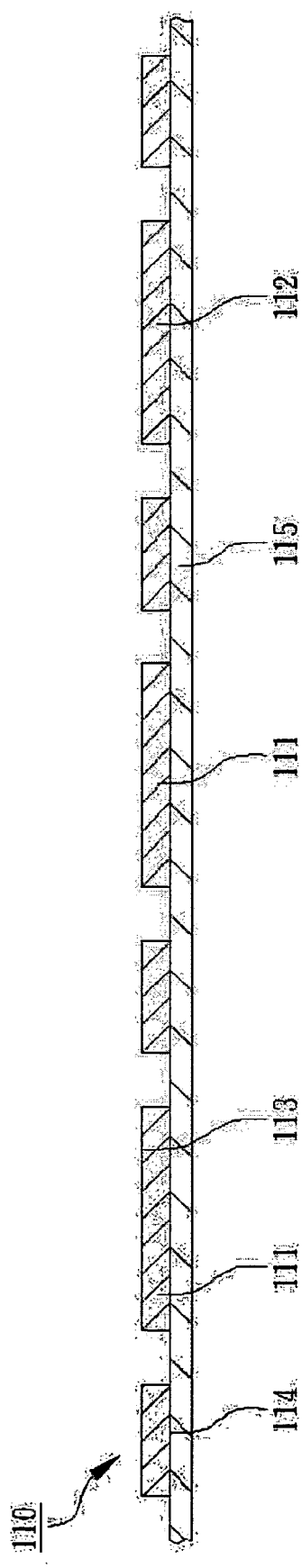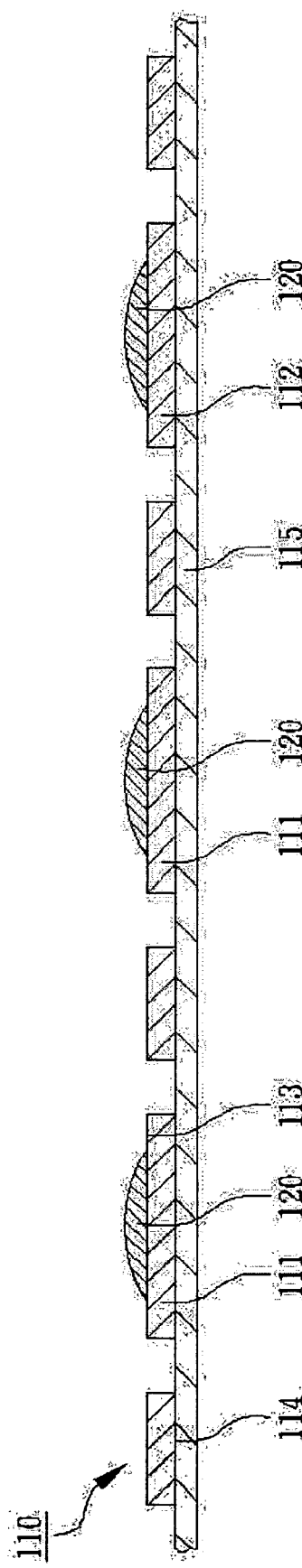
FIG. 2A
FIG. 2B

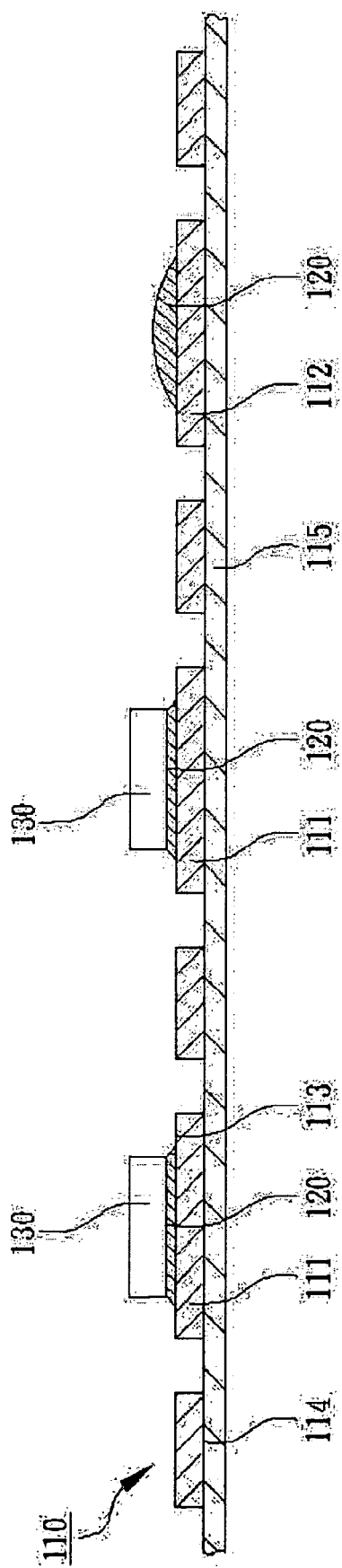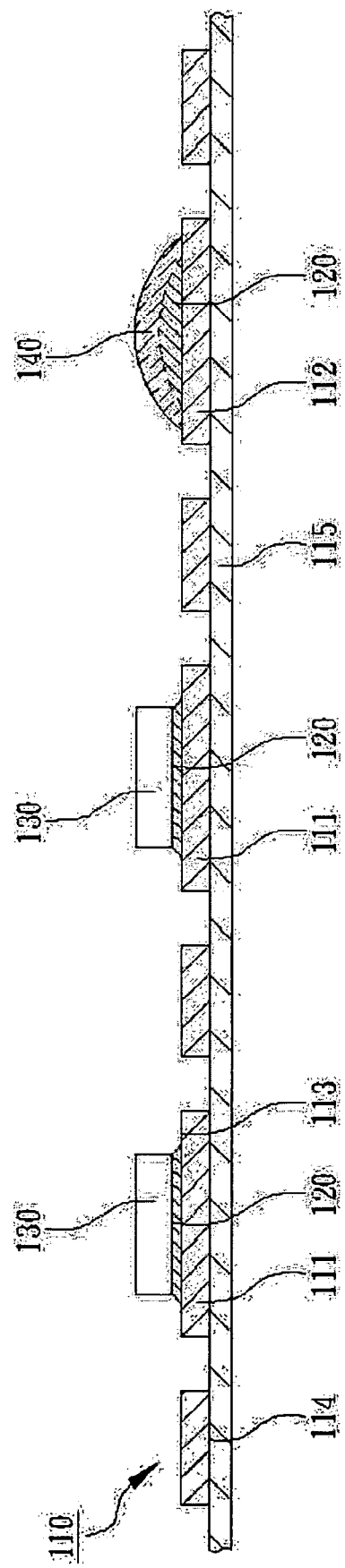

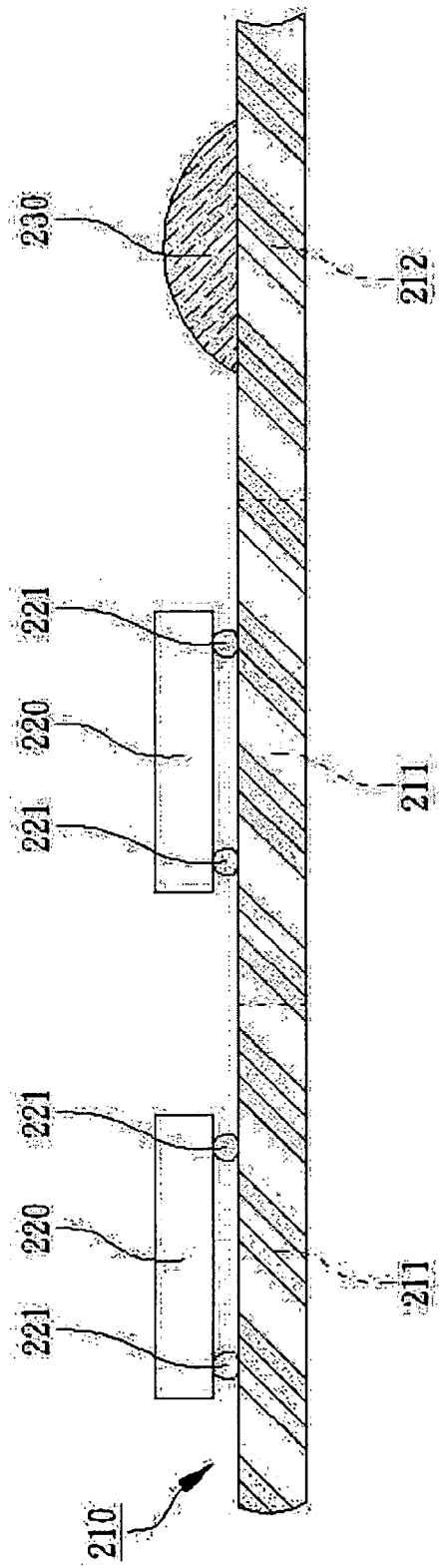
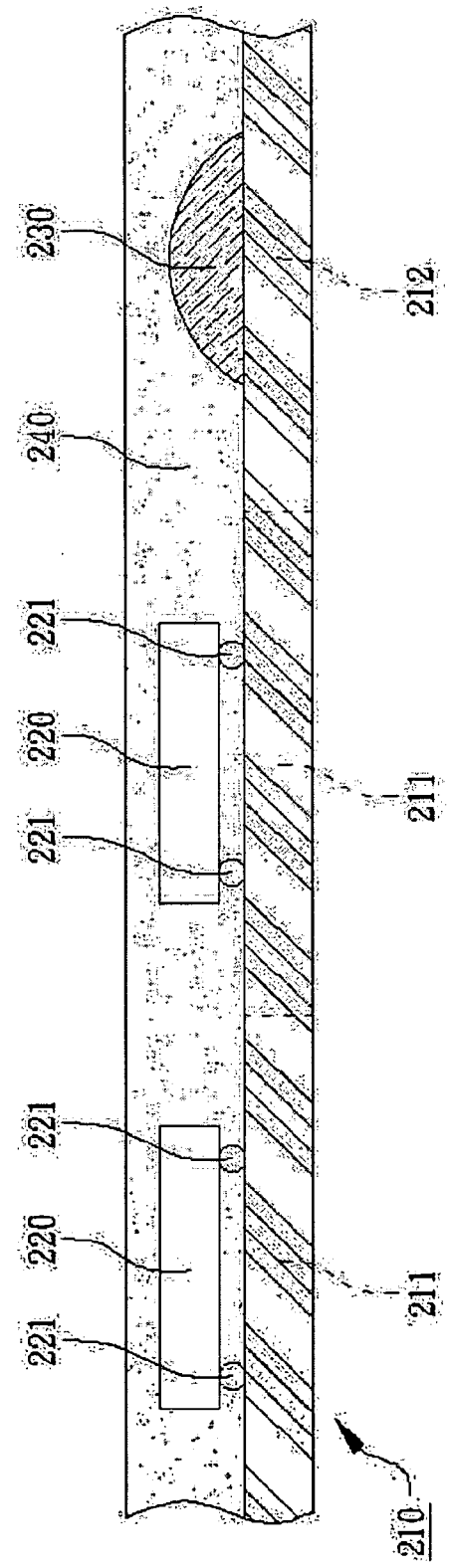
FIG. 4C
FIG. 4D

METHOD FOR BALANCING MOLDING FLOW DURING THE ASSEMBLY OF SEMICONDUCTOR PACKAGES WITH DEFECTIVE CARRYING UNITS

This application claims the benefit of Taiwan application Serial No. 93115529, filed May 31, 2004, the subject matter of which is incorporated herein by reference.

BACKGROUND OF THE INVENTION

1. Field of the Invention

The invention relates in general to a method for balancing molding flow during the assembly of semiconductor packages, and more particularly to a method for balancing molding flow during the assembly of semiconductor packages with defective carrying units.

2. Description of the Related Art

In the light increasing the production capacity and reducing the manufacturing costs, the chip carrier is designed to have a number of carrying units capable of carrying a number of chips in the manufacturing process of more and more semiconductor packages. The chip carrier can be a substrate of a Ball Grid Array package (BGA package) of a quad flat non-lead package (QFN package). However, during the manufacturing or delivery of the chip carrier, it is not guaranteed that each carrying unit is a good part. Once the chip carrier is detected to have a defective carrying unit, normally, a good chip is not attached to the defective carrying unit in the packaging process, thus forming an empty space. Consequently, during molding, the problems of the bonding wire sweep, the substrate warpage or the mold flash might occur due to imbalanced molding flow. To avoid the above problems, a dummy chip needs to be attached to the defective carrying unit of the chip carrier to resolve the problem of defective packages due to the imbalance of molding flow of the molding compound during the manufacturing process.

Firstly, referring to FIG. 1A, a chip carrier 10 is provided. The chip carrier 10 includes a number of good carrying units 11 and at least a defective carrying unit 12. The chip carrier 10 has a front surface 13 and a rear surface 14. The rear surface 14 has a membrane 15 pasted thereon. Further referring to FIG. 1B, a number of chip glues 20 are formed on the good carrying units 11 and the defective carrying unit 12 of the chip carrier 10. Next, referring to FIG. 1C, a number of chips 30 are attached to the good carrying units 11 of the chip carrier 10. Referring to FIG. 1D, a dummy chip 40 is attached to the defective carrying unit 12 of the chip carrier 10. Further referring to FIG. 1E, a number of bonding wires 50 are used to electrically connect the chips 30 and the good carrying units 11. Referring to FIG. 1F, a molding compound 60 is formed on the chip carrier 10 to seal the chips 30 and the dummy chip 40. According to the above manufacturing process, the dummy chip 40 must be obtained first, and then the dummy chip 40 is attached to the defective carrying unit 12 to avoid the occurrence of defective product due to imbalanced molding flow when the molding compound 60 is formed via molding. However, higher manufacturing costs are involved.

SUMMARY OF THE INVENTION

It is therefore an object of the invention to provide a method for balancing molding flow during the assembly of semiconductor packages with defective carrying units. A chip-imitative glue is formed on a defective carrying unit of a chip carrier to balance the molding flow of the molding compound when a molding compound is molded to be formed on the chip carrier, thereby avoiding the problems of the bonding wire sweep, the chip carrier warpage or the mold flash.

The invention achieves the above-identified object by providing a method for balancing molding flow during the assembly of semiconductor packages. Firstly, a chip carrier is provided, wherein the chip carrier includes a number of good carrying units and at least a defective carrying unit. A number of chip glues are formed on the good carrying units of the chip carrier. A number of chips are attached to the good carrying units of the chip carrier, and a chip-imitative glue is formed on the defective carrying unit of the chip carrier. Next, a molding compound is formed on the chip carrier via molding to seal the chips and the chip-imitative glue to balance molding flow.

Other objects, features, and advantages of the invention will become apparent from the following detailed description of the preferred but non-limiting embodiments. The following description is made with reference to the accompanying drawings.

BRIEF DESCRIPTION OF THE DRAWINGS

FIGS. 1A to 1F (Prior Art) are cross-sectional views of a chip carrier during the manufacturing process of semiconductor packages according to prior art;

FIGS. 2A to 2F are cross-sectional views of a chip carrier during the manufacturing process of semiconductor packages by applying a method for balancing molding flow during the assembly of semiconductor packages according to a first embodiment of the invention;

FIGS. 4A to 4D are cross-sectional views of a chip carrier during the manufacturing process of semiconductor packages by applying a method for balancing molding flow during the assembly of semiconductor packages according to a second embodiment of the invention.

DETAILED DESCRIPTION OF THE INVENTION

Figure 1E:
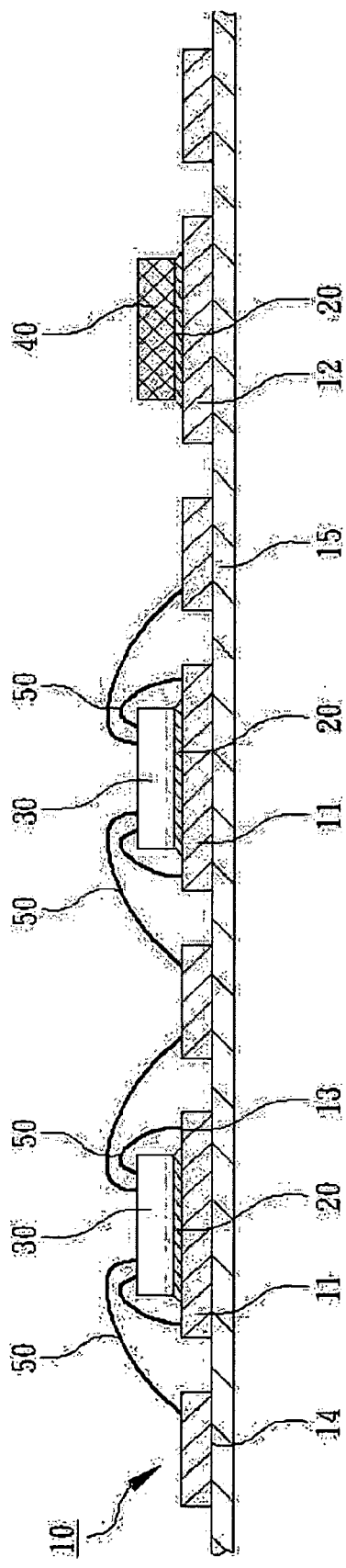
Figure 1F:
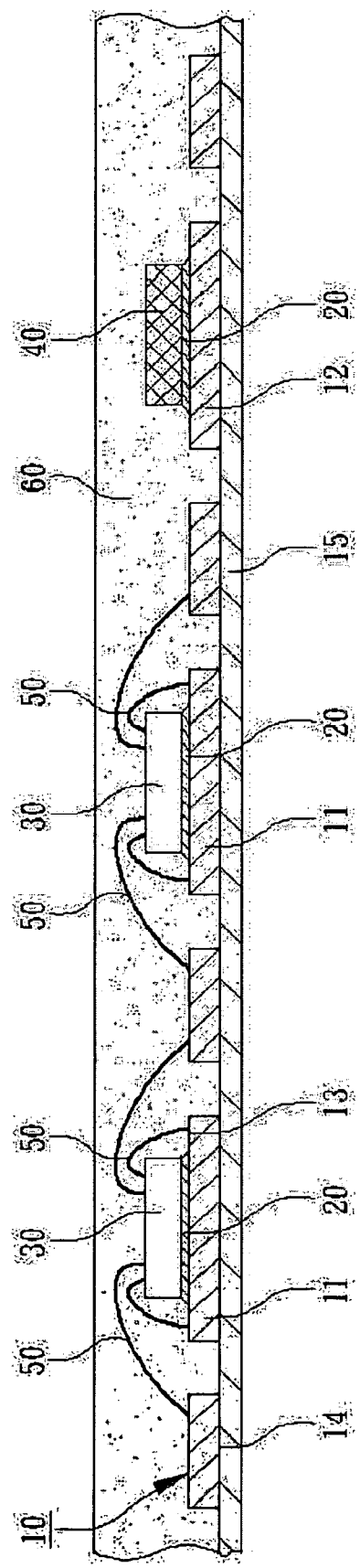
Figure 2E:
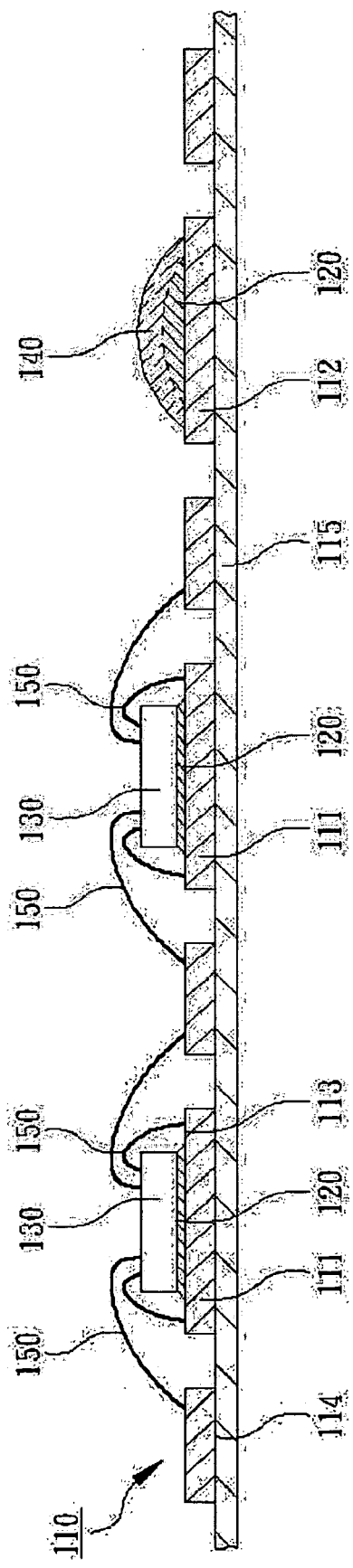
Figure 2F:
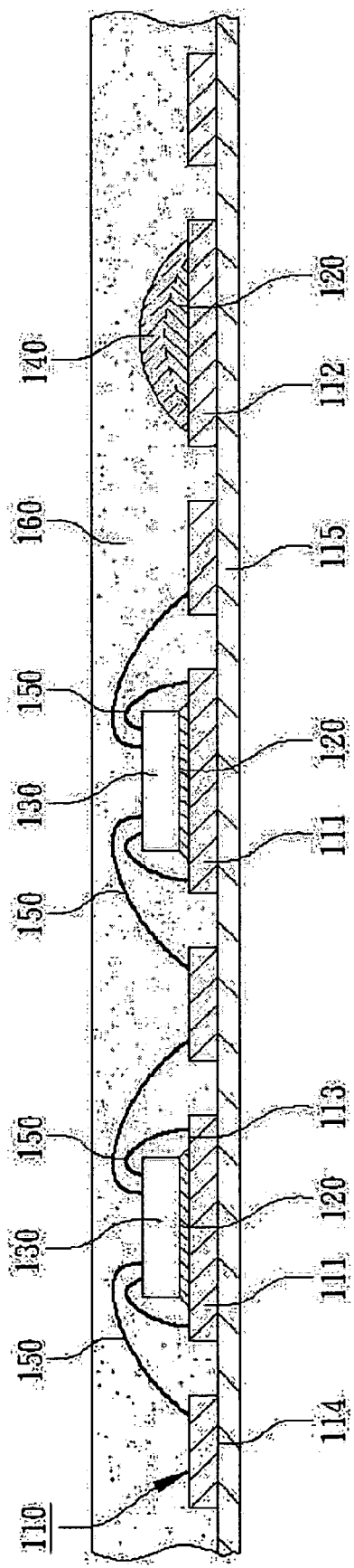
Figure 3:
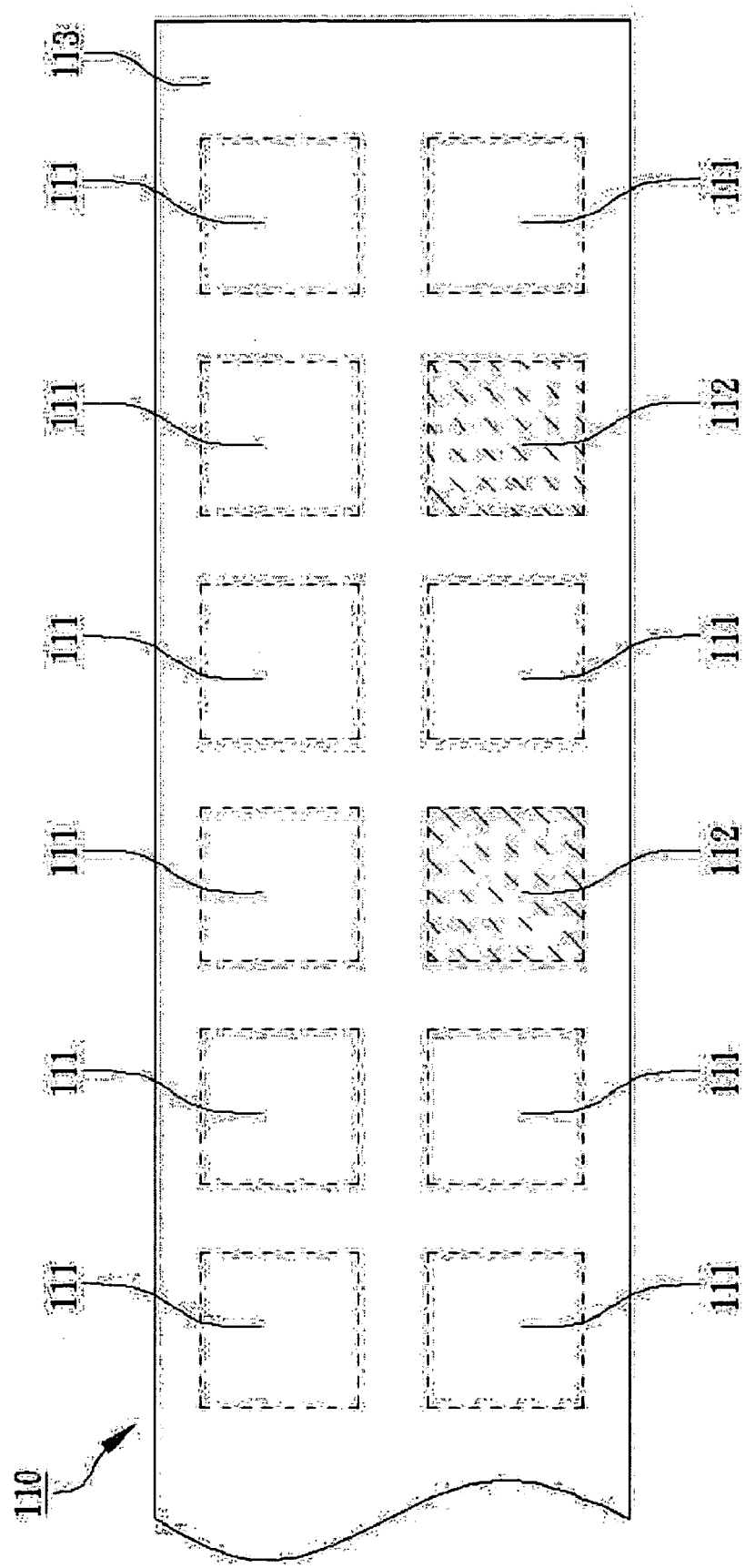
FIG. 3 is a top view of a chip carrier by applying a method for balancing molding flow during the assembly of semiconductor packages according to the first embodiment of the invention.

A method for balancing molding flow during the assembly of semiconductor packages according to a first embodiment of the invention is disclosed below. Referring to FIGS. 2A and 3, a chip carrier 110 is provided. The chip carrier 110, which includes a number of good carrying units 111 and at least a defective carrying unit 112, can be a substrate of a Ball Grid Array package (BGA package) of a quad flat non-lead package (QFN package). In the present embodiment, the chip carrier 110 is exemplified by a lead frame of the QFN package. The chip carrier 110 has a front surface 113 and a rear surface 114, and the rear surface 114 has a membrane 115 pasted thereon. In the embodiment, the good carrying units 111 and defective carrying unit 112 are die pads of the lead frame. Referring to FIG. 2B, a number of chip to glues 120 are formed on the good carrying units 111 and the defective carrying unit 112 of the chip carrier 110, and the material of the chip glues 120 can be epoxy. Referring to FIG. 2C, a number of chips 130 are attached to the good carrying units 111 of the chip carrier 110 via the chip glues 120. Referring to FIG. 2D, a chip-imitative glue 140 is formed on the chip glue 120 disposed on the defective carrying unit 112 of the chip carrier 110, and the volume of the chip-imitative glue 140 is not smaller than the volume of the chip 130 disposed on one of the good carrying units 111. Preferably, the volume of the chip-imitative glue 140 is equal to the volume of each chip 130 in order to imitate a chip or dummy chip formed on the defective carrying unit 112. In other words, the chip-imitative glue 140 can form a simulated chip or dummy chip on the defective carrying unit 112, so that the volume of the object carried by the good carrying unit 111 disposed on the chip carrier 110 is approximately equal to that carried by the defective carrying unit 112 disposed on the chip carrier 110. The material of the chip-imitative glue 140 can be the same with the material of the chip glue 120, such as the epoxy for instance. Preferable, the chip glues 120 and the chip-imitative glue 140 can be further baked to be solidified. Further referring to FIG. 2E, the chips 130 are electrically connected to the chip carrier 110 via a number of bonding wires 150. Further referring to FIG. 2F, a molding compound 160 is formed on the chip carrier 110 via inject molding. The molding compound 160 seals the chips 130, the chip-imitative glue 140, and the bonding wires 150. Besides, anyone who is skilled in the technology will understand that the step of forming the chip-imitative glue 140 on the chip glue 120 of the defective carrying unit 112 can be implemented before the chips 130 are attached to the good carrying units 111. A chip-imitative glue can be formed on the defective carrying unit to continue the subsequent packaging soon after the chip carrier 110 is manufactured and detected to have defective carrying unit 112.

The volume of the chip-imitative glue 140 disposed on the defective carrying units 112 is approximately equal to the volume of each chip 130 disposed on the good carrying units 111, so that the imbalance of molding flow when the molding compound 160 is molded and formed on the chip carrier 110 can be reduced, thereby avoiding the problems of the bonding wire 150 sweep, the chip carrier 110 warpage, or the mold flash due to imbalanced molding flow. The chip-imitative glue 140 is used to displace the dummy chip used in prior art so as to imitate a chip or dummy chip formed on the defective carrying unit 112. Therefore, the number of chip-imitative glues 140 depends on the actual number of defective carrying units 112, and the volume of the chip-imitative glue 140 depends on the volume of the chips 130, thus the manufacturing costs are reduced. Besides, under the spirit of the invention, the chip glues 120 can only be formed on the good carrying units 111. That is to say, the chip glues 120 are not formed on the defective carrying unit 112, and the chip-imitative glue 140 is directly formed on the defective carrying unit 112 with the volume of the chip-imitative glue 140 being equal to the sum of the volume of each chip 130 and chip glue 120 disposed on each good carrying unit 111, so that the imbalance of molding flow when the molding compound 160 is formed on the chip carrier 110 can be reduced.

Figure 4A:
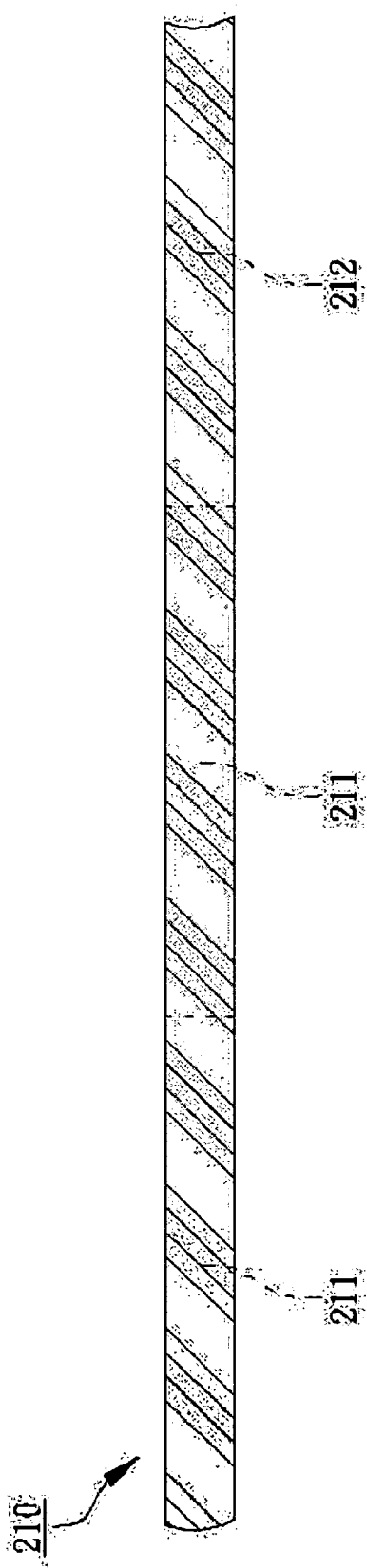
Figure 4B:
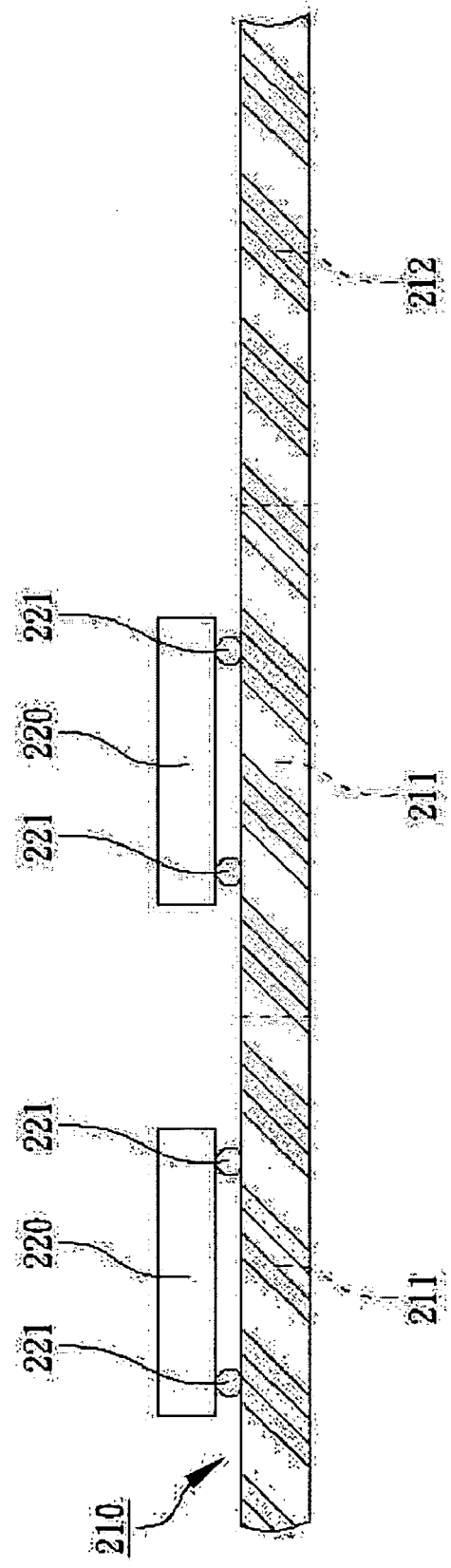

A method for balancing molding flow during the assembly of semiconductor packages according to a second embodiment of the invention is disclosed below. Referring to FIG. 4A, a chip carrier 210 is provided. The chip carrier 210 includes a number of good carrying units 211 and at least a defective carrying unit 212. In the present embodiment, the chip carrier 210 is a substrate. Referring to FIG. 4B, a number of chips 220 are attached to the good carrying units 211 of the chip carrier 210. In the embodiment, the chips 220 have a number of bumps 221 to be flipped on the good carrying units 211 of the chip carrier 210, and if necessary, an underfill layer (not shown in the diagram) can be formed between the chips 220 and the chip carrier 210 to seal the bumps 221. Further referring to FIG. 4C, a chip-imitative glue 230 is formed on the defective carrying unit 212 of the chip carrier 210. Preferably, the volume of the chip-imitative glue 230 is equal to the volume of the flip-chip 220 and corresponding underfill layer to imitate a chip or dummy chip formed on the defective carrying unit 212. The material of the chip-imitative glue 230 can be the same with the material of the underfill layer, such as resin for instance. Further referring to FIG. 4D, a molding compound 240 is formed on the chip carrier 210 to seal the chips 220 so that the imbalance of molding flow can be reduced. The chip-imitative glue 230 is used to displace the dummy chip used in prior art.

While the invention has been described by way of example and in terms of a preferred embodiment, it is to be understood that the invention is not limited thereto. On the contrary, it is intended to cover various modifications and similar arrangements and procedures, and the scope of the appended claims therefore should be accorded the broadest interpretation so as to encompass all such modifications and similar arrangements and procedures.

What is claimed is:

1. A method for balancing molding flow during the assembly of semiconductor packages, comprising:
   providing a chip carrier, wherein the chip carrier has a plurality of good carrying units and at least a defective carrying unit;
   forming a plurality of chip glues on the good carrying units and the defective carrying unit of the chip carrier;
   using the chip glues to attach a plurality of chips on the good carrying units of the chip carrier;
   forming a chip-imitative glue on the defective carrying unit of the chip carrier; and
   forming a molding compound on the chip carrier to seal the chips and the chip-imitative glue; said chip imitative glue reduces the imbalance of molding flow when the mold compound is formed on the chip.

2. The method according to claim 1, a volume of the chip-imitative glue is substantially equal to a volume of each chip.

3. The method according to claim 1, wherein a material of the chip-imitative glue is the same with a material of the chip glues.

4. The method according to claim 1, wherein the chip carrier is a lead frame of a quad flat non-lead package (QFN package).

5. The method according to claim 4, wherein the good carrying units and the defective carrying unit are die pads of the lead frame.

6. The method according to claim 4, wherein the chip carrier has a rear surface with a membrane.

7. The method according to claim 1, wherein the chip carrier is a substrate.

8. The method according to claim 1, further comprising: electrically connecting the chips with the chip carrier.

9. The method according to claim 8, wherein the chips are electrically connected to the chip carrier via a plurality of bonding wires.

10. A method for balancing molding flow during the assembly of semiconductor packages, comprising:
    providing a chip carrier, wherein the chip carrier has a plurality of good carrying units and at least a defective carrying unit;
    attaching a plurality of chips to the good carrying units of the chip carrier;

forming a chip-imitative glue on the defective carrying unit of the chip carrier; and forming a molding compound on the chip carrier, wherein the molding compound seals the chips and the chip-imitative glue said chip imitative glue reduces the imbalance of molding flow when the mold compound is formed on the chip.

11. The method according to claim 10, further comprising: forming a plurality of chip glues on the good carrying units of the chip carrier.

12. The method according to claim 11, wherein a volume of the chip-imitative glue is equal to a sum of volumes of one chip and the corresponding chip glue on each good carrying unit.

13. The method according to claim 12, wherein the chips are flipped on the good carrying units of the chip carrier.

14. The method according to claim 13, further comprising:

forming an underfill layer between the chips and the chip carrier.

15. The method according to claim 14, wherein a volume of the chip-imitative glue is equal to a sum of volumes of each chip and the corresponding underfill layer.

16. The method according to claim 14, wherein a material of the chip-imitative glue is the same with a material of the underfill layer.

17. The method according to claim 10, wherein the chip carrier is a lead frame of a quad flat non-lead package (QFN package).

18. The method according to claim 10, wherein the good carrying units and defective carrying unit are die pads of a lead frame.

19. The method according to claim 18, wherein the chip carrier has a rear surface with a membrane.

20. The method according to claim 10, wherein the chip carrier is a substrate.

* * * * *